United States Patent [19]

Yamada

[11] Patent Number: 5,459,326

[45] Date of Patent: Oct. 17, 1995

[54] METHOD FOR SURFACE TREATMENT WITH EXTRA-LOW-SPEED ION BEAM

[75] Inventor: Isao Yamada, Hyogo, Japan

[73] Assignee: Research Development Corporation of Japan, Tokyo, Japan

[21] Appl. No.: 370,221

[22] Filed: Jan. 9, 1995

Related U.S. Application Data

[63] Continuation of Ser. No. 202,883, Feb. 28, 1994, abandoned, which is a continuation of Ser. No. 891,173, May 29, 1992, abandoned.

[30] Foreign Application Priority Data

May 31, 1991 [JP] Japan .................. 3-129512

[51] Int. Cl.[6] .................................................. H01J 37/00
[52] U.S. Cl. ........................... 250/398; 250/492.2
[58] Field of Search ..................... 250/492.2, 492.21, 250/423 R, 398

[56] References Cited

U.S. PATENT DOCUMENTS

| | | | |
|---|---|---|---|
| 4,124,802 | 11/1978 | Terasawa et al. ........... | 250/423 R |
| 4,559,096 | 12/1985 | Friedman et al. ............ | 156/272.2 |
| 4,902,572 | 4/1988 | Horne et al. .................. | 250/427 |
| 4,959,242 | 9/1990 | Itoh ............................... | 427/38 |
| 5,019,712 | 5/1991 | Kmauer ........................ | 250/423 R |
| 5,069,967 | 12/1991 | Yokoyama et al. ........... | 427/131 |
| 5,118,950 | 6/1992 | Bahns et al. .................. | 250/424 |
| 5,196,102 | 3/1993 | Kumar .......................... | 427/528 |

*Primary Examiner*—Bruce C. Anderson
*Attorney, Agent, or Firm*—Wenderoth, Lind & Ponack

[57] ABSTRACT

A method of treating the surface of a substrate using an extra-low-speed ion beam. The method involves forming a cluster, which is a lump-shaped group of atoms or molecules of a gaseous substance at the ambient temperature, by adiabatic expansion form a high pressure region into a high-vacuum region thorough a small-bore conical nozzle, pouring electrons onto the cluster, accelerating the thus generated cluster ions by acceleration voltage, and irradiating the ions onto the surface of a solid. The method permits surface cleaning of a substrate without causing damage or defects, ion injection into the very shallow surface layer portion, and CVD.

9 Claims, 8 Drawing Sheets

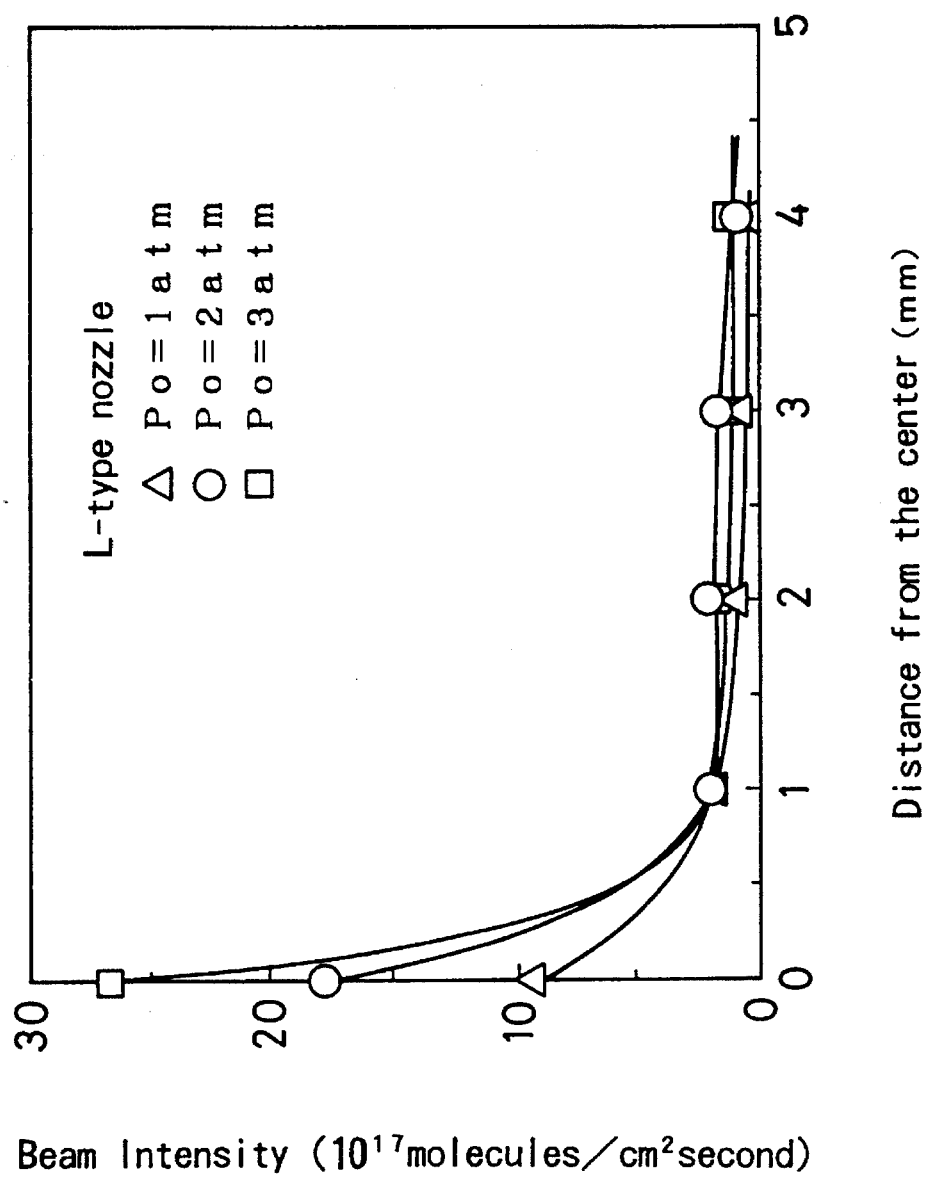

METHOD FOR SURFACE TREATMENT WITH EXTRA-LOW-SPEED ION BEAM

This application is a continuation application of Ser. No. 08/202,883, filed Feb. 28, 1994, which in turn is a continuation application of Ser. No. 07/891,173, filed May 29, 1992, both applications being now abandoned.

BACKGROUND OF THE INVENTION

1. Field of the Invention

The present invention relates to a method for surface treatment of a substrate with an extra-low-speed ion beam. More particularly, the present invention relates to a method for surface treatment with an extra-low-speed ion beam, which is useful for surface cleaning or quality improvement of a semiconductor or other electronic devices, and uses a cluster of a gaseous substance at the ambient temperature.

DESCRIPTION OF RELATED ART

Various vapor reaction methods for surface cleaning of an electronic device such as a semiconductor, or for surface improvement or thin film formation by ion injection of such copies have been developed. In particular, such methods as sputtering, vacuum deposition, CVD and ion beam vapor deposition have been put into practice.

In the case of these conventional methods, however, it is difficult to avoid an undesirable effect such as damage to, or degeneration of, the solid surface to be treated, thus posing a serious problem for the manufacture of high-accuracy and high-quality electronic devices.

More specifically, a method of surface cleaning which comprises irradiating inert gas ions such as argon onto a solid surface, and sputtering impurity atoms and oxides adsorbed by the surface, in known. Is this conventional method, however, the ion current, becomes extremely smaller with an energy input of up to 100 eV, so that it is necessary to use an ion beam with an energy input increased to several keV. This method is defective in that a defect is caused on the solid surface, or argon injected into the surface becomes an impurity atom, thus preventing a clean surface from being obtained. Since, in the iron irradiation onto a solid surface using monoatomic or monomolecular ions, ions are injected into the interior of the solid, it is difficult to improve the quality of only the very shallow surface layer portion.

There has therefore been a strong demand for the development of a new ion beam technology which would permit cleaning of a solid surface without causing damage while using an ion beam, and which would permit ion injection into the very shallow surface layer portion of the solid surface, as a fundamental technology directed toward the progress of such sophisticated electronics as ULSI.

SUMMARY OF THE INVENTION

The present invention was developed in view of the circumstances as described above, and it has an object to provide a novel method for ion beam surface treatment which solves the drawbacks in the conventional ion beam technology and permits surface cleaning without damage and free from defects on a solid surface and formation of an ion-injected layer only in the very shallow surface layer portion.

As a means to solve the above-mentioned problems, the present invention provides a method for extra-low-speed ion beam surface treatment which comprises the steps of forming a cluster which is a lump-shaped group of atoms or molecules of a gaseous substance at the ambient temperature, pouring electrons onto the thus formed cluster, and accelerating the generated ions with accelerating voltage to irradiate the accelerated ions onto the surface of a solid.

BRIEF DESCRIPTION OF THE DRAWINGS

FIG. 3 is an intensity distribution diagram of $CO_2$ beam;

DETAILED DESCRIPTION OF PREFERRED EMBODIMENTS

Embodiments of the present invention include non-damage cleaning of a solid surface with cluster ions and ion injection into the very shallow surface layer portion on the order of two to ten-atoms in thickness.

More particularly, the present invention is characterized by using a gaseous substance at the ambient temperature as described above such as a carbide, an oxide, a fluoride, a chloride, a hydride, a sulfide, or a rare gas or a mixed gaseous substance containing two or more of the above at an appropriate ratio, and irradiating cluster ions of said substance as an extra-low-speed ion beam onto the solid surface. In this case, as the cluster is usually composed of several hundred atoms, each atom is irradiated as an extra-low-speed ion beam of up to 10 cV even under an applied voltage of 1 kV.

The method for extra-low-speed ion beam surface treatment of the present invention will now be described further in detail by means of some examples.

EXAMPLES

Figure 1:
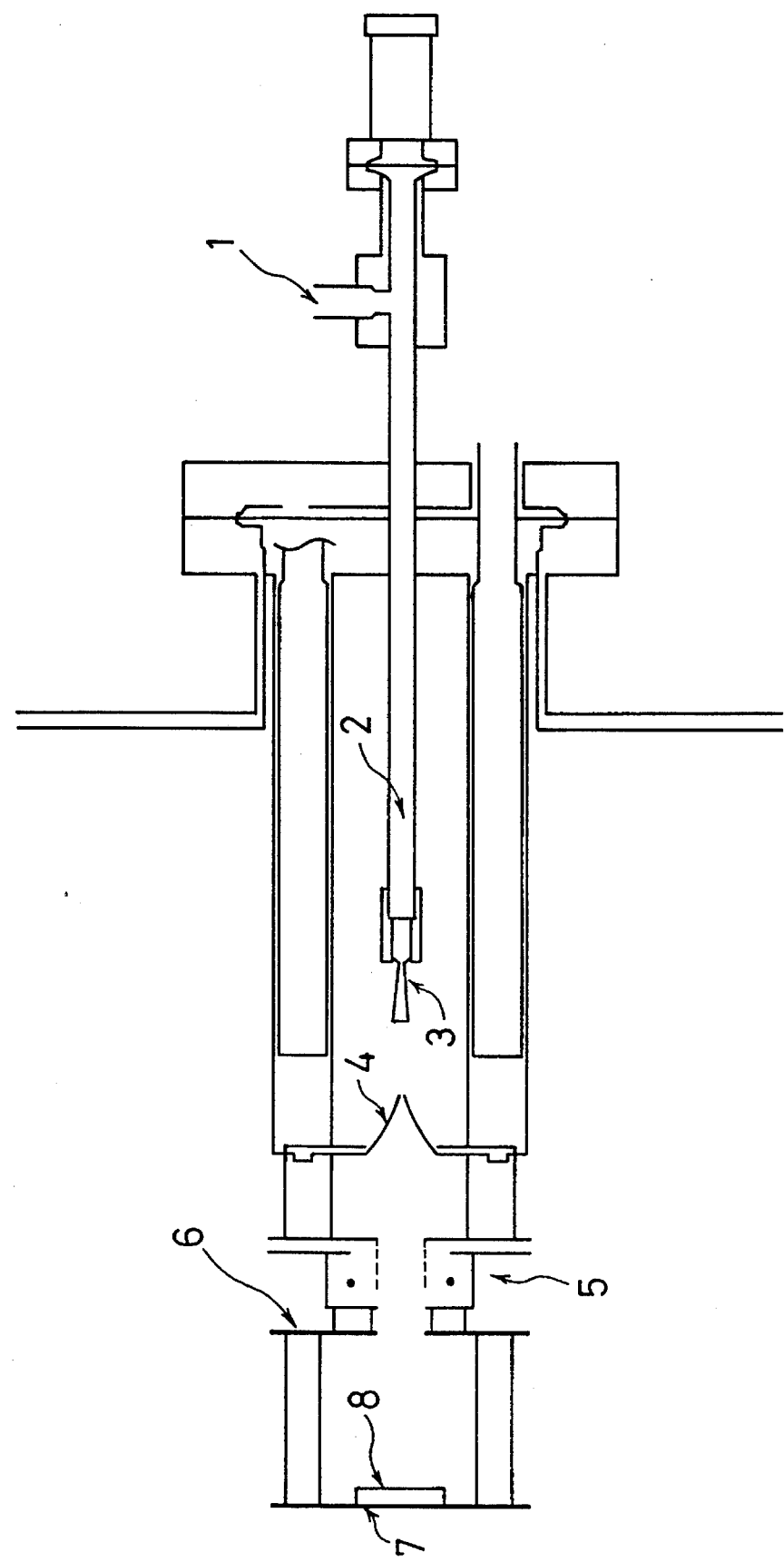
FIG. 1 is a sectional view illustrating an embodiment of the apparatus for the application of ion beam treatment of the present invention.

Among the attached drawings, FIG. 1 is a schematic representation illustrating an apparatus for extra-low-speed ion beam surface treatment of the present invention. The surface cleaning method using a cluster ion beam is described with reference to FIG. 1. A gas in the gaseous form at the ambient temperature such as $CO_2$, a fluoride or a chloride is introduced through an inlet port (1) into a gas source (2) until gas pressure of several atmospheres (atm) is reached. Then, the thus introduced gas is ejected from a nozzle (3) provided at the tip of the gas source (2). A cluster consisting of several hundred atoms, or a lump-shaped group of atoms or molecules, is formed under the effect of adiabatic expansion. This cluster is directed through a skimmer (4) to an ionization section (5). As cluster passes through the ionization section (5), part of the cluster is ionized to become a cluster ion. This cluster ion is then accelerated by a negative acceleration voltage applied to an acceleration electrode (6) and a substrate holder (7) and hits the substrate (8). As a cluster is composed of several hundred atoms, each atom impinges the substrate, forming an extra-low-speed beam of up to 10 eV even with an applied voltage of 1 kV.

Figure 2A:
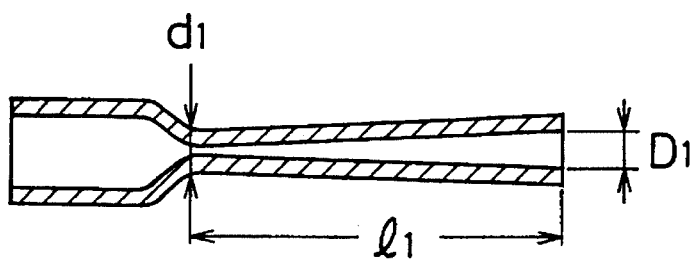
FIGS. 2 (a), (b) and (c) are sectional views illustrating typical shapes of the nozzle of the apparatus shown in FIG. 1.
Figure 2B:
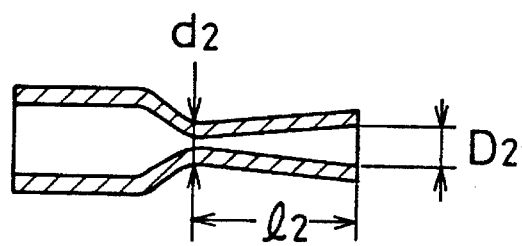
Figure 2C:
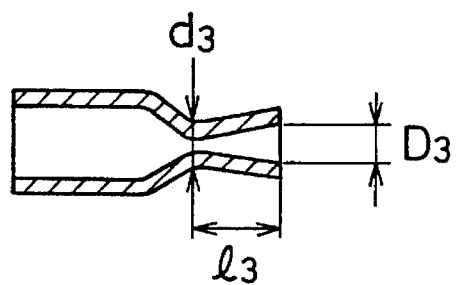

FIGS. 2 (a), (b) and (c) illustrate examples of the nozzle (3) for this apparatus. All these nozzles may be made of glass, and may be called an L-type nozzle (a), an M-type nozzle (b) and an S-type nozzle (c), respectively.

The design was made so that the nozzle diameter ($d_1$ to $d_3$) and the exit diameter ($D_1$ to $D_3$) were 0.1 mm and 3 mm, respectively. The observed values of the manufactured nozzle diameter were as follows:

$d_1$= 0.18 mm $d_2$= 0.15 mm $d_8$= 0.12 min.

The length of the ejecting section of the nozzles ($l_1$ to $l_3$) was 32 ram, 14 mm and 10 ram, respectively, for the L-type, M-type and S-type nozzles. The length and the diameter of the nozzles varied with the kind of gas, and were of the dimensions with which a cluster was formed by adiabatic expansion. The material for the nozzle may be a metal, not glass.

Figure 8:
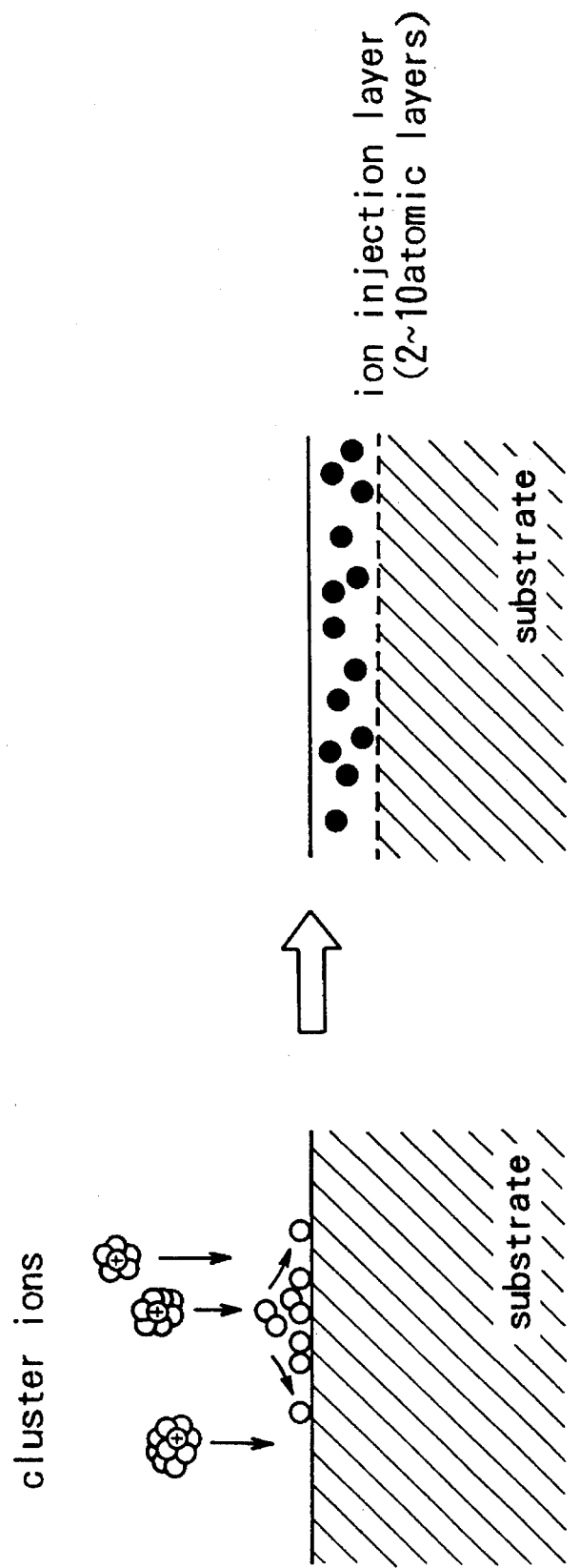
FIG. 8 is a schematic representation of ion injection using cluster ions.

FIG. 8 illustrates the intensity distribution of beam ejected from the L-type nozzle. The beam intensity was measured with an ion gauge. The distance between the skimmer (4) and the nozzle (3) was fixed at 1 cm, and the beam intensity was measured while changing the nozzle (3) position in a direction perpendicular to the beam. FIG. 3 reveals that the beam comprises a directional beam deviating toward the center and the degree of directivity is higher according as the gas supply pressure (Pn) increases.

Figure 4:
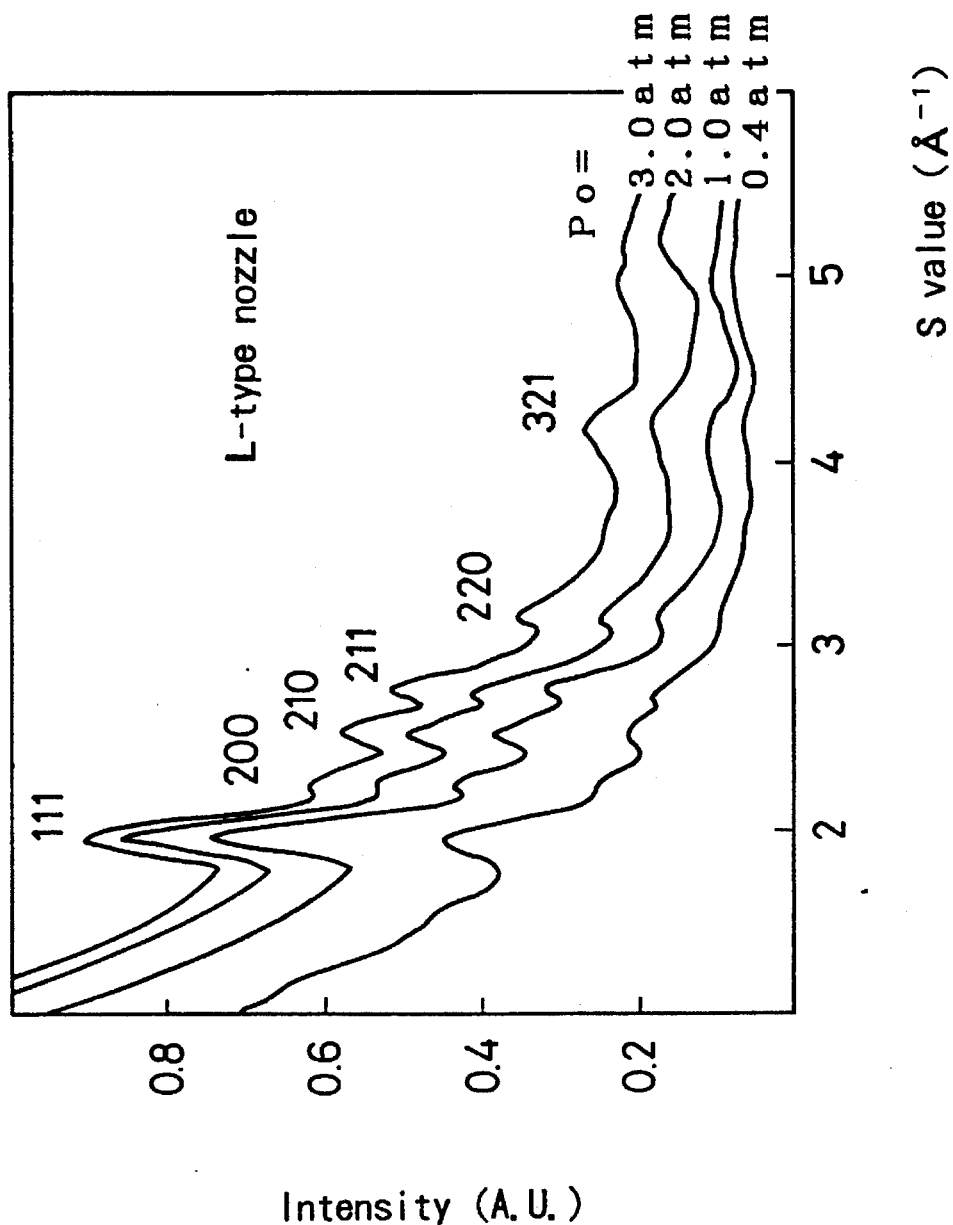
FIG. 4 is an intensity distribution diagram of the electron beam pattern of $CO_2$ beam.
Figure 5:
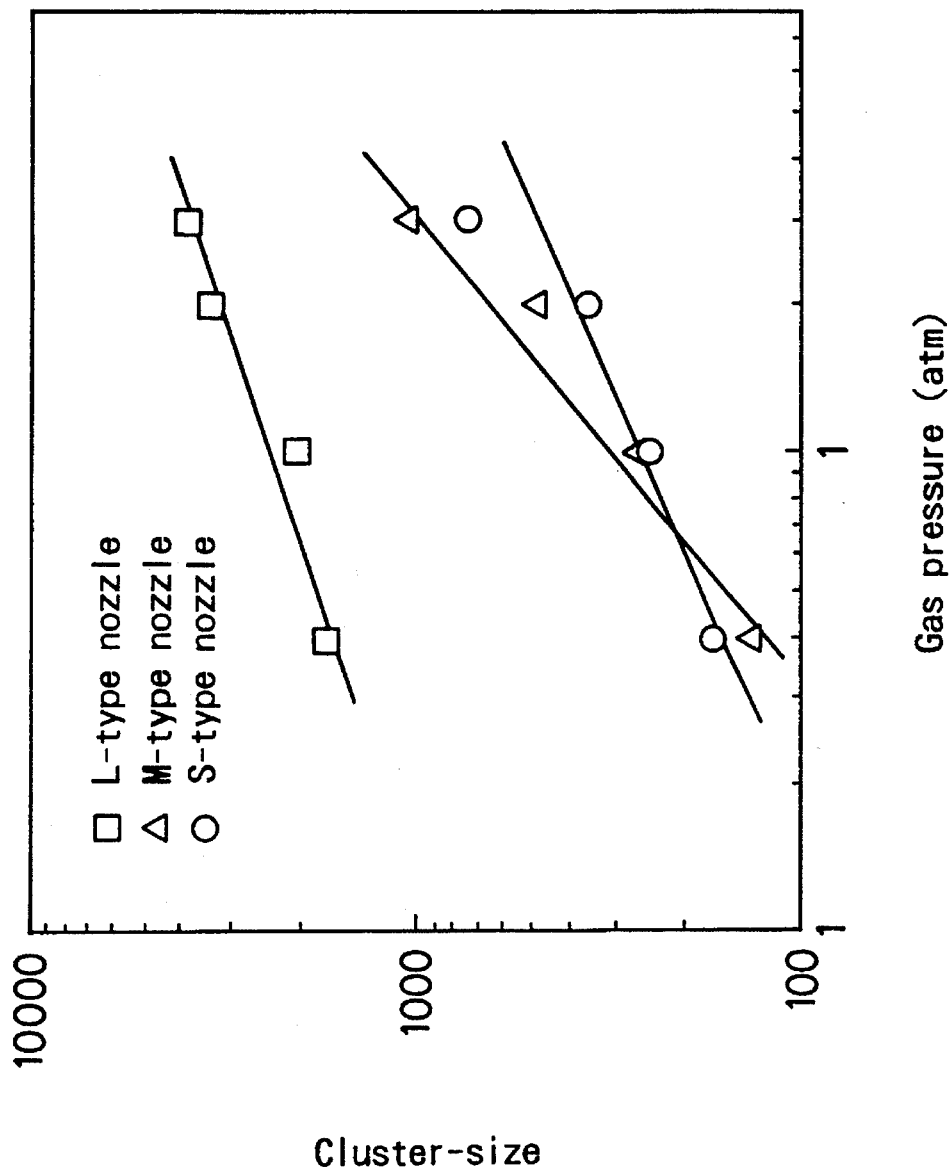
FIG. 5 is a diagram illustrating the relationship between the cluster size and the gas supply pressure.

FIG. 4 illustrates the intensity distribution of the electron beam diffraction pattern of $CO_2$ beam as measured by changing the gas supply pressure (Po) from 0.4 to 3.0 arm, with the use of an L-type nozzle. The S-value represents the relationship S=(4 /λ) sin 20. FIG. 4 reveals that, along with the increases in the gas supply pressure (Po), each peak becomes higher. The magnitude, i.e., the size of a cluster can be calculated from the half-value width of the diffraction peak from the (111) plane and the position (diffraction angle) of that peak. The results of calculation are shown in FIG. 5, which demonstrates that the cluster size increases according as the gas supply pressure increases in all cases of L-type, M-type and S-type nozzles. In the L-type nozzle, in particular, the values of size are distributed within a range of from 1,000 to 5,000.

Figure 6:
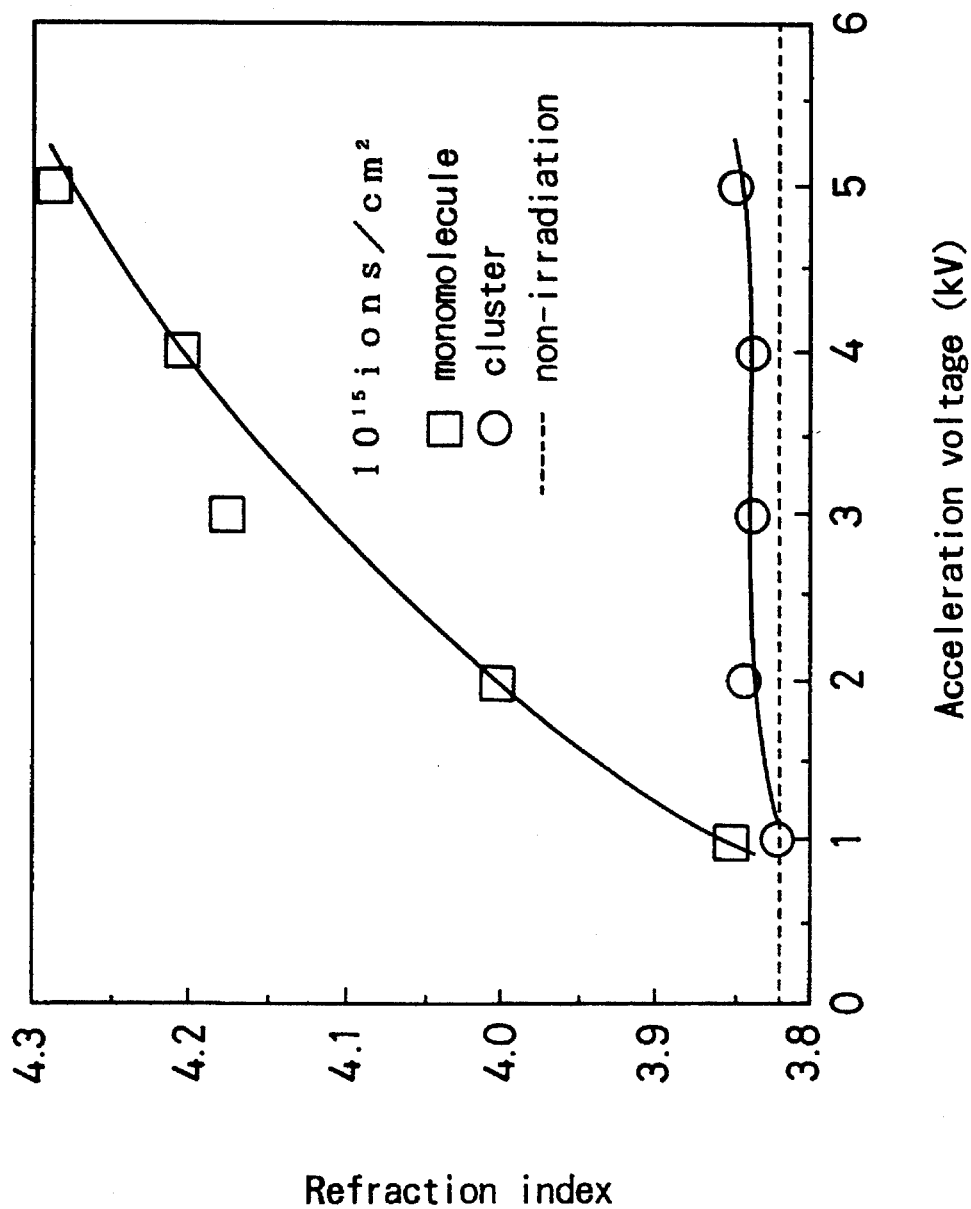
FIG. 6 is diagram illustrating the relationship between the index of refraction and acceleration voltage.

In order to investigate the damaging effect exerted when irradiating $CO_2$ cluster ions onto a silicon substrate, cluster ions were irradiated onto a silicon substrate by changing the acceleration voltage, and then the index of refraction of the silicon substrate was measured with an ellipsometer. FIG. 6 illustrates the relationship between the index of refraction and acceleration voltage for the silicon substrate irradiated with $CO_2$ cluster and $CO_2$ monomolecular ions. In the case of the $CO_2$ monomolecule, the index of refraction increases with the increase in the acceleration voltage, and the surface is in the non-crystalline state by the ion irradiation. In the irradiation of $CO_2$ cluster ions, on the other hand, the index of refraction is substantially constant for an acceleration voltage of up to 4 kV. The value hereof is of the same order as that of a silicon substrate not irradiated, and the damage by irradiation is very slight.

Figure 7:
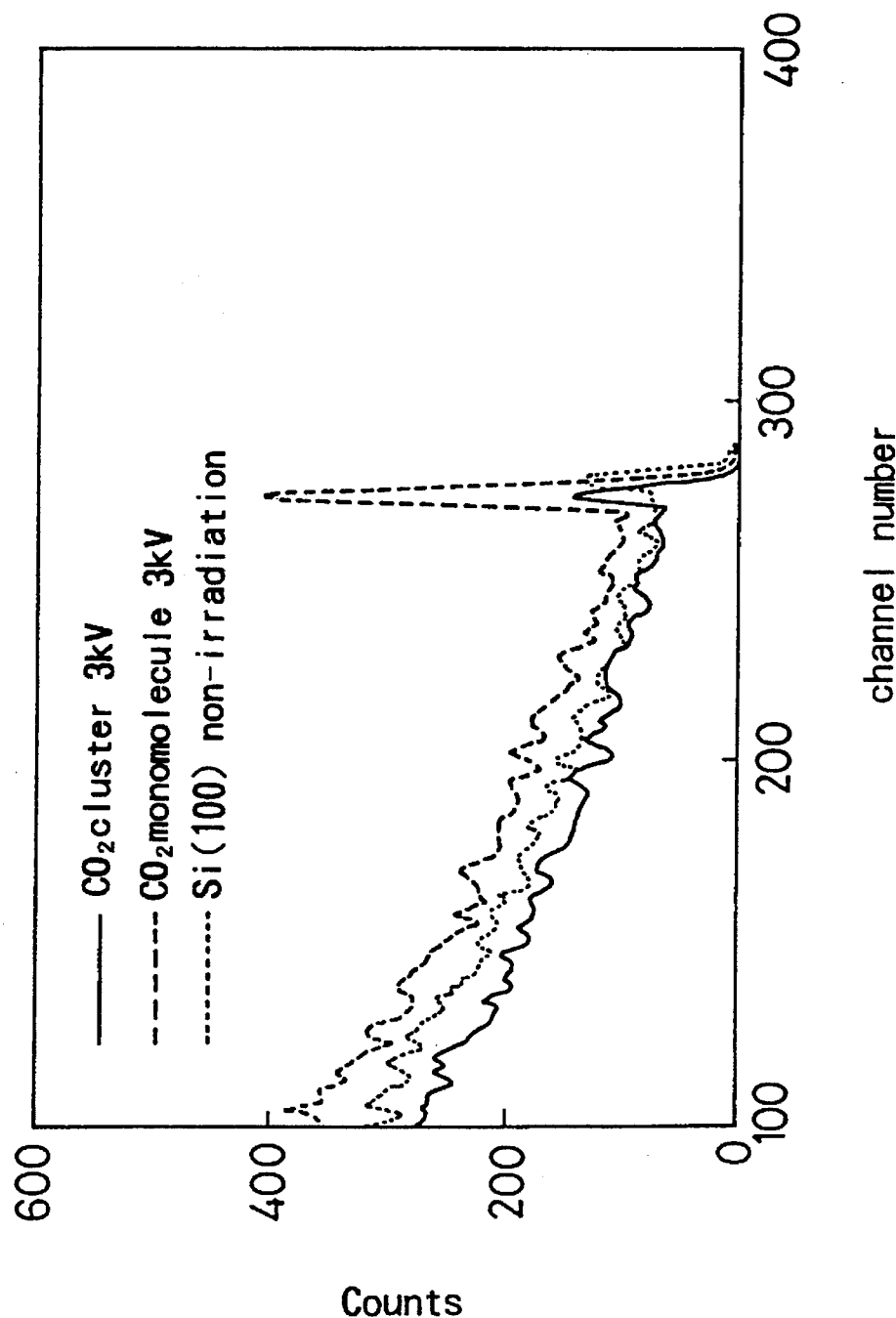
FIG. 7 is an RBS spectral diagram.

FIG. 7 illustrates the results of measurement, by the Ratherford back scattering (RBS) method, of a silicon substrate after irradiation of $CO_2$ cluster ions and monomolecular ions onto the silicon substrate under an acceleration voltage of Va= 3 kV. The area of a peak near the 280th channel suggests that, in the case of irradiation of $CO_2$ cluster ions, the number of damaged silicon atoms is of the order of the area of peak of the non-irradiated silicon substrate, thus showing that the damage caused by ion irradiation is slight. The energy input per molecule of cluster, which is approximately 6 eV, is far smaller than the energy input per molecule of 3 keV.

The results presented above teach that, by using cluster ions, it is possible to decrease the energy imparted to the substrate surface to the energy necessary for displacing the surface atoms, thus causing no defects on the substrate surface. Since, furthermore, the adsorption energy of impurity atoms and oxides adsorbed onto the substrate surface is up to several eV, impurities and oxides adsorbed onto the substrate surface are removed by sputtering from the surface. Fluorine and chlorine, which are chemically active, are effective for removing oxides and the like from the solid surface without the necessity of heating, in cooperation with the dynamic energy possessed by the individual atoms. The cluster ions may be as required irradiated onto the substrate surface after mass separation by the use of an electric field or a magnetic field.

Because of the availability as described above of a clean surface free from defects on the surface of a solid at a low temperature according to the present invention, it is possible to achieve monocrystal growth with the use of this clean surface, and furthermore, to apply this technology also for producing a monolithic electronic device with this material, thus providing remarkable effects. Since it is also possible to control at will the energy input of a cluster to a substrate, surface improvement is achievable through ion injection into a very shallow surface layer portion, as shown in FIG. 8, for example. In addition, depending upon the kind of gas, it is possible to accomplish chemical vapor deposition (CVD) based on low-speed ion beam by causing accumulation onto the substrate surface.

According to the present invention, as described above in detail, it is possible to conduct non-damage surface cleaning through the use of an extra-low-speed ion beam and a high-accuracy and high-precision surface treatment such as ion injection into a surface layer portion.

What is claimed is:

1. A method of cleaning the surface of a substrate with a gas cluster ion beam, which comprises the steps of (1) forming a cluster, which is a lump-shaped group of atoms or molecules of a gaseous substance selected from the group consisting of $CO_2$ and a rare gas, at ambient temperature, by adiabatic expansion from a high pressure region into a high-vacuum region through a small-bore, conical nozzle, (2) directing electrons onto said cluster, (3) accelerating the thus generated cluster ions by acceleration voltage, and (4) irradiating said ions onto the surface of a substrate.

2. The method for surface cleaning as claimed in claim 1, wherein the substrate surface is subjected to a non-damage cleaning.

3. A method for surface cleaning as claimed in claim 1, wherein ions are injected into the shallow surface layer portion of the substrate to effect non-damage cleaning of the surface.

4. The method for surface treatment as claimed in claim 1, wherein said cluster ions are formed by introducing said gaseous substance into a chamber until a gas pressure of several atmospheres is reached, ejecting said pressurized gas through said nozzle into said high-vacuum region to generate said cluster of atoms or molecules, and ionizing said cluster by pouring electrons onto said cluster to generate said cluster ions.

5. The method for surface cleaning according to claim 1, wherein the gaseous substance is $CO_2$.

6. The method according to claim 1, wherein the gaseous substance is a rare gas.

7. The method for surface cleaning according to claim 1, wherein the cluster ions are accelerated and irradiated onto the substrate at an extra-low speed of up to 10 eV.

8. The method according to claim 7, wherein the cluster ions are accelerated at an acceleration voltage of up to 4 kV.

9. The method according to claim 8, wherein the cluster ions are accelerated at an acceleration voltage of 1 kV.

* * * * *